US009977304B2

(12) United States Patent
Liu et al.

(10) Patent No.: US 9,977,304 B2
(45) Date of Patent: *May 22, 2018

(54) DISPLAY DEVICE

(71) Applicant: InnoLux Corporation, Miao-Li County (TW)

(72) Inventors: Yu-Tsung Liu, Miao-Li County (TW); Kuan-Yu Chiu, Miao-Li County (TW); Te-Yu Lee, Miao-Li County (TW); Chao-Hsiang Wang, Miao-Li County (TW)

(73) Assignee: INNOLUX CORPORATION, Miao-Li County (TW)

( * ) Notice: Subject to any disclaimer, the term of this patent is extended or adjusted under 35 U.S.C. 154(b) by 0 days. days.

This patent is subject to a terminal disclaimer.

(21) Appl. No.: 15/681,477

(22) Filed: Aug. 21, 2017

(65) Prior Publication Data
US 2017/0343846 A1    Nov. 30, 2017

Related U.S. Application Data

(63) Continuation of application No. 14/729,315, filed on Jun. 3, 2015, now Pat. No. 9,772,535.

(30) Foreign Application Priority Data

Jan. 21, 2015   (TW) .............................. 104101901 A

(51) Int. Cl.
G02F 1/136        (2006.01)
G02F 1/1368       (2006.01)
G02F 1/1362       (2006.01)
H01L 27/32        (2006.01)
H01L 29/786       (2006.01)
(Continued)

(52) U.S. Cl.
CPC ...... *G02F 1/1368* (2013.01); *G02F 1/136227* (2013.01); *H01L 27/124* (2013.01); *H01L 27/3248* (2013.01); *H01L 27/3258* (2013.01); *H01L 27/3276* (2013.01); *H01L 29/78675* (2013.01); *H01L 51/0096* (2013.01)

(58) Field of Classification Search
None
See application file for complete search history.

(56) References Cited

U.S. PATENT DOCUMENTS 7,656,467 B2    2/2010  Choo
2003/0199114 A1  10/2003  Fukagawa et al.
(Continued)

*Primary Examiner* — Richard Kim
(74) *Attorney, Agent, or Firm* — McClure, Qualey & Rodack, LLP

(57) ABSTRACT

A display device includes a first substrate, and a semiconductor layer, and a gate line disposed over the first substrate. The gate line overlaps the semiconductor layer. The display device also includes a first insulating layer disposed over the semiconductor layer, wherein a first opening is formed through the first insulating layer. The display device further includes a metal pad disposed over the first insulating layer, being electrically connected to the semiconductor layer through the first opening, and a data line disposed over the first insulating layer, wherein the data line crosses the gate line and is electrically connected to the metal pad. In addition, the display device includes a second insulating layer disposed over the metal pad and the first insulating layer, wherein a second opening is formed through the second insulating layer, and the second opening at least partially overlaps the gate line.

19 Claims, 9 Drawing Sheets

(51) Int. Cl.
*H01L 27/12* (2006.01)
*H01L 51/00* (2006.01)

(56) References Cited

U.S. PATENT DOCUMENTS

| | | |
|---|---|---|
| 2012/0013839 A1 | 1/2012 | Kastsumoto |
| 2012/0313845 A1 | 12/2012 | Onogi |
| 2013/0075799 A1 | 3/2013 | Oyamada |
| 2014/0319530 A1 | 10/2014 | Chung |
| 2015/0219973 A1 | 8/2015 | Kawashima |

DISPLAY DEVICE

CROSS REFERENCE TO RELATED APPLICATIONS

This Application is a Continuation of pending U.S. patent application Ser. No. 14/729,315, filed Jun. 3, 2015, which claims priority of Taiwan Patent Application No. 104101901, filed on Jan. 21, 2015, the entirety of which is incorporated by reference herein.

BACKGROUND OF THE INVENTION

Field of the Invention

The present invention relates to display devices, and in particular to display devices using thin film transistors (TFTs).

Description of the Related Art

In order to fulfill the requirements of high-speed image processing and high-quality image displays, flat-panel displays, such as color liquid-crystal displays (LCDs) have become popular. LCDs typically have an upper and a lower substrate with electrodes thereon. These substrates are sealed with adhesive materials, and a liquid-crystal material is sealed between these two substrates. Prior to liquid-crystal injection, spacers are sprayed between the substrates in order to maintain a constant distance therebetween.

Thin film transistors (TFTs) are typically formed above the lower substrate as switching devices. Each TFT has a gate electrode connected to a scanning line, a source electrode connected with a data line, and a drain electrode connected to a pixel electrode. The upper substrate is disposed above the lower substrate and includes a color filter and a plurality of light-shielding materials (formed of resin black matrix, for example). Edges of the lower and upper substrates are sealed with adhesive materials, and liquid-crystal materials are provided between the upper and lower substrates. The lower substrate is also called a first substrate, and elements such as TFTs and electrical contacts are formed thereover, which are typically defined by performing several photolithography steps.

However, as improvements are made in the image resolution of display devices, display devices for maintaining or improving the performance of the aperture ratio and image display of display devices are needed, especially as the size of the elements such as TFTs and contacts formed over the lower substrate is further reduced.

BRIEF SUMMARY OF THE INVENTION

An exemplary display device comprises an array substrate defined with a plurality of pixel structures arranged in an array. In one embodiment, each of the pixel structures comprises a semiconductor layer disposed over a substrate and a first metal layer disposed over the substrate, and the first metal layer functions as a gate line. The pixel structure further comprises a first insulating layer disposed over the semiconductor layer, wherein the first insulating layer comprises a first opening exposing a top surface of the semiconductor layer and a sidewall surface of the first insulating layer. The pixel structure further comprises a metal pad disposed over the first insulating layer, being formed over the top surface of the semiconductor layer and the sidewall surface of the first insulating layer through the first opening. The pixel structure further comprises a second insulating layer disposed over the metal pad and the first insulating layer, wherein the second insulating layer comprises a second opening exposing the metal pad over the sidewall surface of the first insulating layer. In one embodiment, the sequence of the first opening, the second opening, and the first metal layer along a direction is the first metal layer, the second opening, and the first opening.

In another embodiment, the display device further comprises a transparent substrate and a display layer disposed between the transparent substrate and the array substrate.

In some embodiments, a display device includes a first substrate, a semiconductor layer disposed over the first substrate, and a gate line disposed over the first substrate, wherein the gate line overlaps the semiconductor layer. The display device also includes a first insulating layer disposed over the semiconductor layer, wherein a first opening is formed through the first insulating layer. The display device further includes a metal pad disposed over the first insulating layer, wherein the metal pad is electrically connected to the semiconductor layer through the first opening. In addition, the display device includes a data line disposed over the first insulating layer, wherein the data line crosses the gate line, and the data line is electrically connected to the metal pad. The display device also includes a second insulating layer disposed over the metal pad and the first insulating layer, wherein a second opening is formed through the second insulating layer, and the second opening at least partially overlaps the gate line.

In some embodiments, a display device includes a first substrate, a semiconductor layer disposed over the first substrate, and a gate line disposed over the first substrate, wherein the gate line overlaps the semiconductor layer. The display device also includes a first insulating layer disposed over the semiconductor layer, wherein a first opening is formed through the first insulating layer. The display device further includes a metal pad disposed over the first insulating layer, wherein the metal pad is electrically connected to the semiconductor layer through the first opening. In addition, the display device includes a data line disposed over the first insulating layer, wherein the data line crosses the gate line, and the data line is electrically connected to the metal pad. The display device also includes a second insulating layer disposed over the metal pad and the first insulating layer, wherein a second opening is formed through the second insulating layer, and the metal pad at least partially overlaps the gate line.

A detailed description is given in the following embodiments with reference to the accompanying drawings.

BRIEF DESCRIPTION OF THE DRAWINGS

The invention can be more fully understood by reading the subsequent detailed description and examples with references made to the accompanying drawings, wherein.

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

Figure 1:
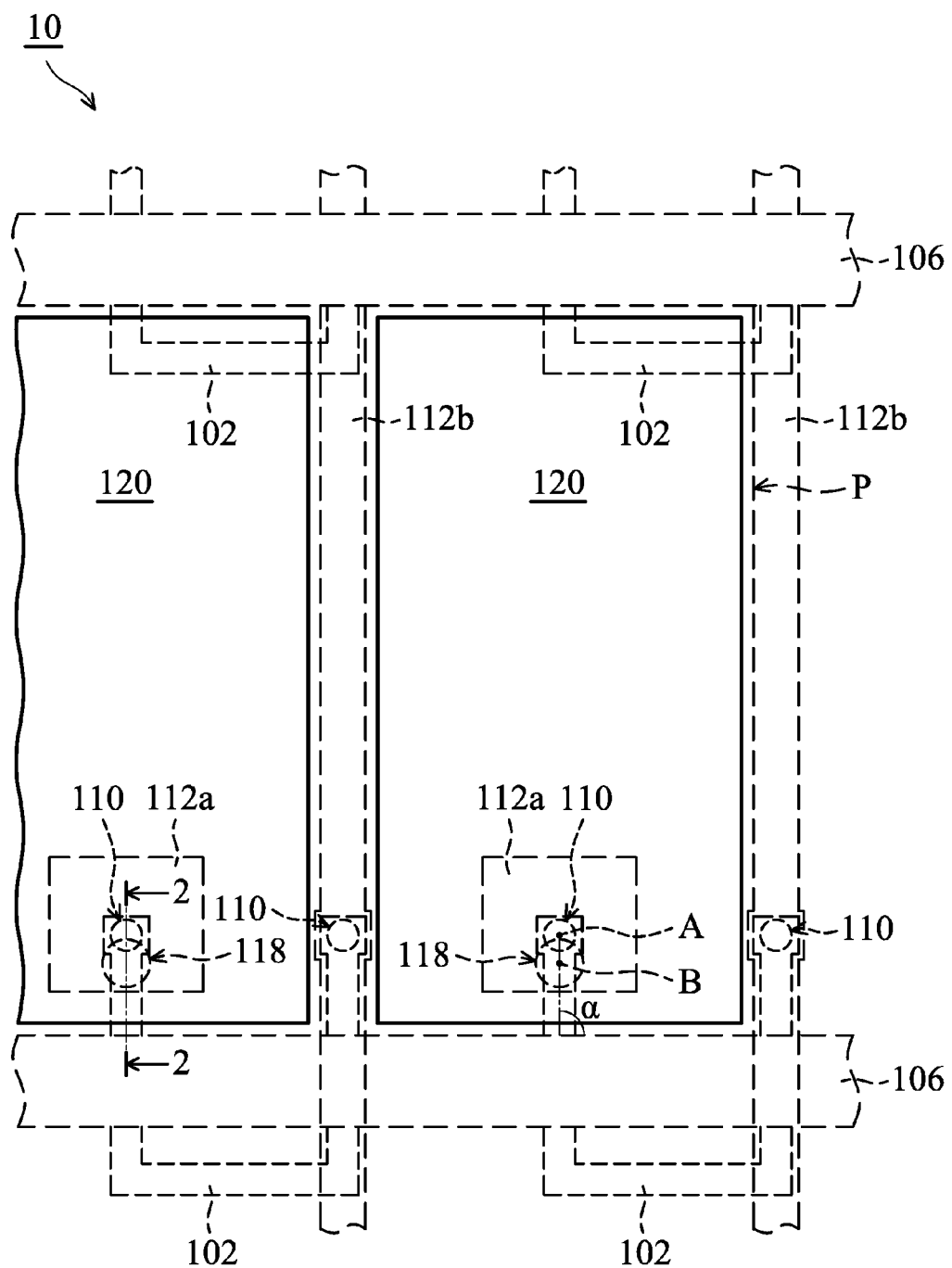
FIG. 1 is a schematic top view showing the layout of an array substrate according to an embodiment of the invention.
Figure 2:
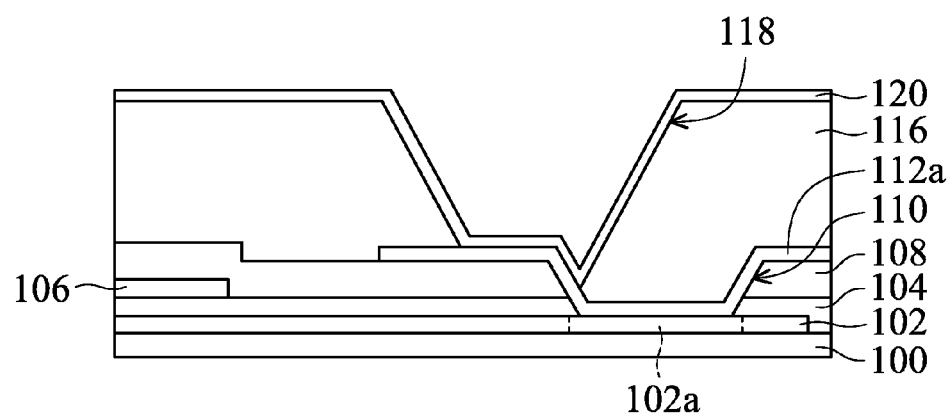
FIG. 2 is a schematic view showing a cross section of the array substrate along the line 2-2 in FIG. 1.

FIGS. 1-2 are schematic diagrams showing an exemplary array substrate 10 applicable in display devices such as color liquid-crystal display devices. Herein, FIG. 1 is a schematic top view of the array substrate 10, and FIG. 2 is a schematic view showing a cross section of the array substrate 10 along the line 2-2 in FIG. 1.

In FIG. 1, the array substrate 10 mainly includes a substrate 100 (not shown here, see FIG. 2), a plurality of U-shaped semiconductor layers 102, a plurality of first metal layers 106, an first insulating layer 108, a plurality of first openings 110, a second metal layer 112 including a plurality of metal pads 112a and a plurality of data lines 112b, a second insulating layer 116, a plurality of second openings 118, and a plurality of transparent electrodes 120. In one embodiment, the plurality of U-shaped semiconductor layers 102 are separately disposed over the substrate 100, and the plurality of first metal layers 106 extend along a first direction (e.g. the X direction). The plurality of first metal layers 106 are separately disposed over the substrate 100 to respectively cover one of the semiconductor layers 102. In addition, the first insulating layer 108 (not shown here, see FIG. 2) is formed over the substrate 100, the semiconductor layers 102 and the first metal layers 106, and the plurality of data lines 112b extend along a second direction (e.g. the Y direction) to be separately disposed over the insulating layer 108 to partially cover a portion of one of the semiconductor layers 102. Moreover, the plurality of metal pads 112a are respectively disposed over a portion of the first insulating layer 108 between two adjacent data lines 112b to partially cover another portion of one of the semiconductor layers 102. Moreover, the plurality of first openings 110 are separately disposed in the first insulating layer 108 to respectively expose a top surface (not shown here, see FIG. 2) of portions of the semiconductor layer 102, and a portion of the data line 112b respectively fills one of the first openings 110 to form an electrical connection with the semiconductor layer 102. Moreover, the second insulating layer 116 (not shown here, see FIG. 2) is blanketly formed over the substrate 100, the data lines 112b and the first insulating layer 108, and the plurality of second openings 118 are separately disposed in a portion of the second insulating layer 116 to respectively expose a portion of one of the data lines 112b and partially overlap one of the underlying first openings 110. Moreover, the plurality of transparent electrodes 120 are separately disposed over the second insulating layer 116 in a plurality of pixel regions P defined by the adjacent and interlacing gate lines (i.e. the first metal layer 106) and data lines (i.e. the data lines 112b of the second metal layer 112), and a portion of the transparent electrodes 120 fill in one of the second openings 118 to contact the data line 112b. In each of these pixel regions P, a respective pixel structure is formed therein.

The following description uses a structure in a single pixel region P as an example. As shown in FIG. 1, the first metal layers 106 extending along the first direction such as the X direction may function as the gate lines, and the data lines 112b extending along the second direction such as the Y direction may function as the data lines. In addition, the first openings 110 may function as first contact hole, and the second openings 118 may function as second contact holes. Herein, the metal pad 112a formed in the first opening 110 is used for electrically connecting a drain region of a thin film transistor device with a sequentially formed pixel electrode, and the second opening 118 partially overlaps the first opening 110, such that a portion of the metal pad 112a is exposed and the transparent electrode 120 formed in the second opening 118 partially overlaps and contacts the data line 112b to form electrical connections. The transparent electrode 120 may function as the pixel electrode. The source region (not shown) of a thin film transistor will be electrical connected with the data line 112b of the second metal layer 112 to receive data of images.

FIG. 2 is a schematic view showing a cross section of the array substrate 10 along the line 2-2 in FIG. 1.

In FIG. 2, a third insulating layer 104 is disposed between the semiconductor layer 102 and first metal layer 106 to function as a gate insulating layer of a thin film transistor. A drain region 102a is formed in a portion of the semiconductor layer 102, and the first opening 110 is formed through the first insulating layer 108 and the third insulating layer 104 to partially expose a top surface of the drain region 102a, and the data line 112b conformably forms over surfaces of the first insulating layer 108 and the third insulating layer 104 and fills the first opening 110. The data line 112b covers and contacts the sidewall surfaces of the first insulating layer 108 and third insulating layer 104 and the top surface of the drain region 102a of the semiconductor layer 102 exposed by the first opening 110 through the first opening 110.

In addition, the second opening 118 formed in the second insulating layer 116 partially overlaps the first opening 110 in the pixel regions P, thereby exposing a portion of the metal pad 112a in the first opening 110 and over the first insulating layer 108. In another embodiment, the second opening 118 may expose the metal pad 112a over the first insulating layer 108 and the sidewall and bottom portions of the metal pad 112a, and the transparent electrode 120 is not only formed over the top surface of the second insulating layer 116 but also in the second opening 118 to contact the portions of the metal pad 112a exposed by the second opening 118. It should be noted that the area of the metal pad 112a exposed by the second opening 118 is greater than the area of the top surface of the semiconductor layer 102 exposed by the first opening 110. In other words, the size of the second opening 118 is greater than the size of the first opening 110 exposing the drain region 102a but not includes the size of the first opening 110 exposing the source region (not shown).

As shown in FIGS. 1-2, since the second opening 118 is arranged between the first opening 110 and the first metal layer 106, the coverage area of the transparent electrode 120 in the pixel regions P can be increased, thereby improving an aperture ratio of the pixel regions P.

Still referring to FIGS. 1-2, the first opening 110 and the second opening 118 in the pixel regions P are tapered openings that reduce in size from top to bottom. For the purpose of simplicity, only a maximum size of the first opening 110 and the second opening 118 are shown in FIG. 1, and the first opening 110 on the drain region 102a and the second opening 118 have a geometric center A and B, respectively.

Figure 3:
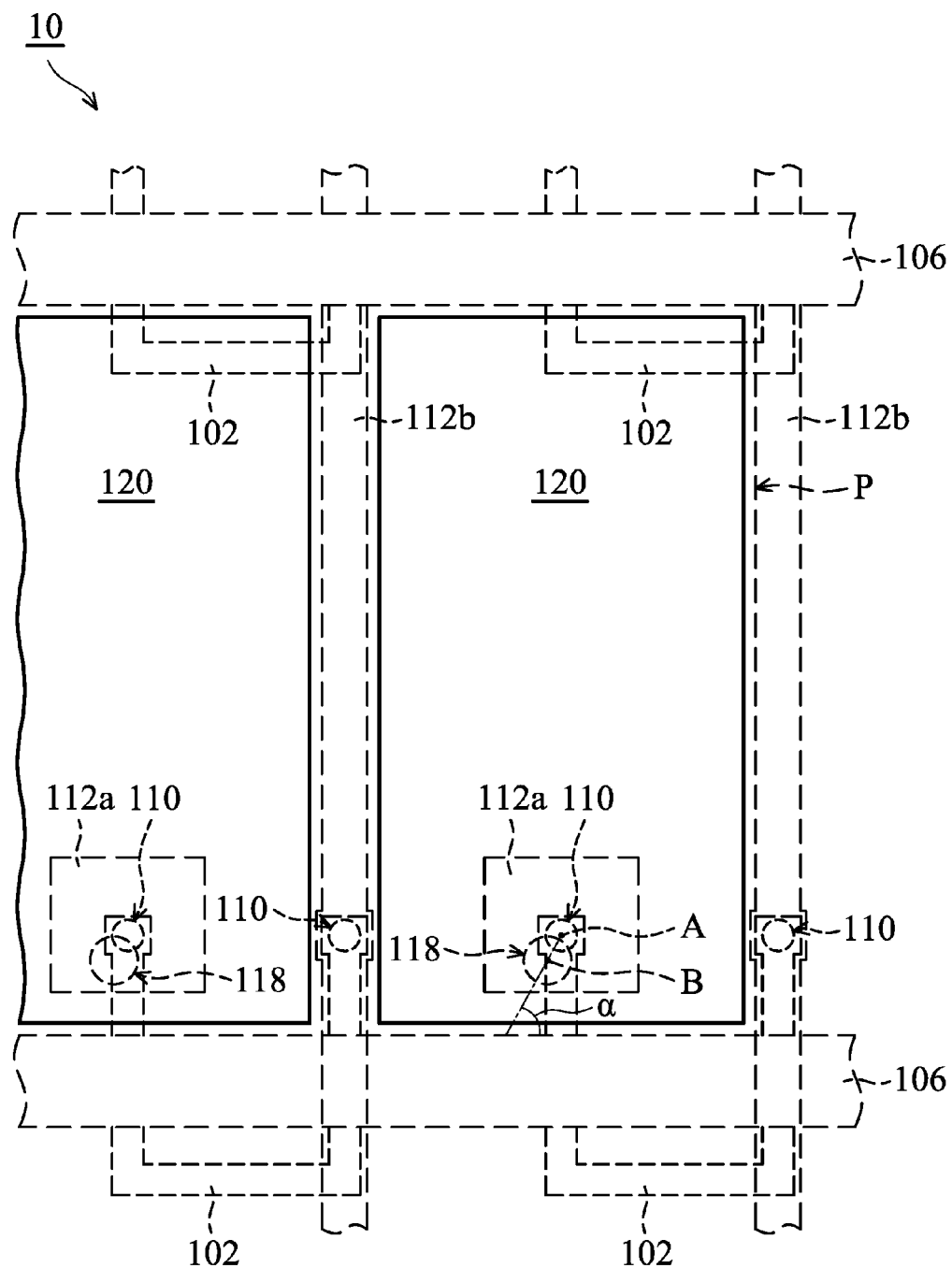
FIG. 3 is a schematic top view showing the layout of an array substrate according to another embodiment of the invention.
Figure 4:
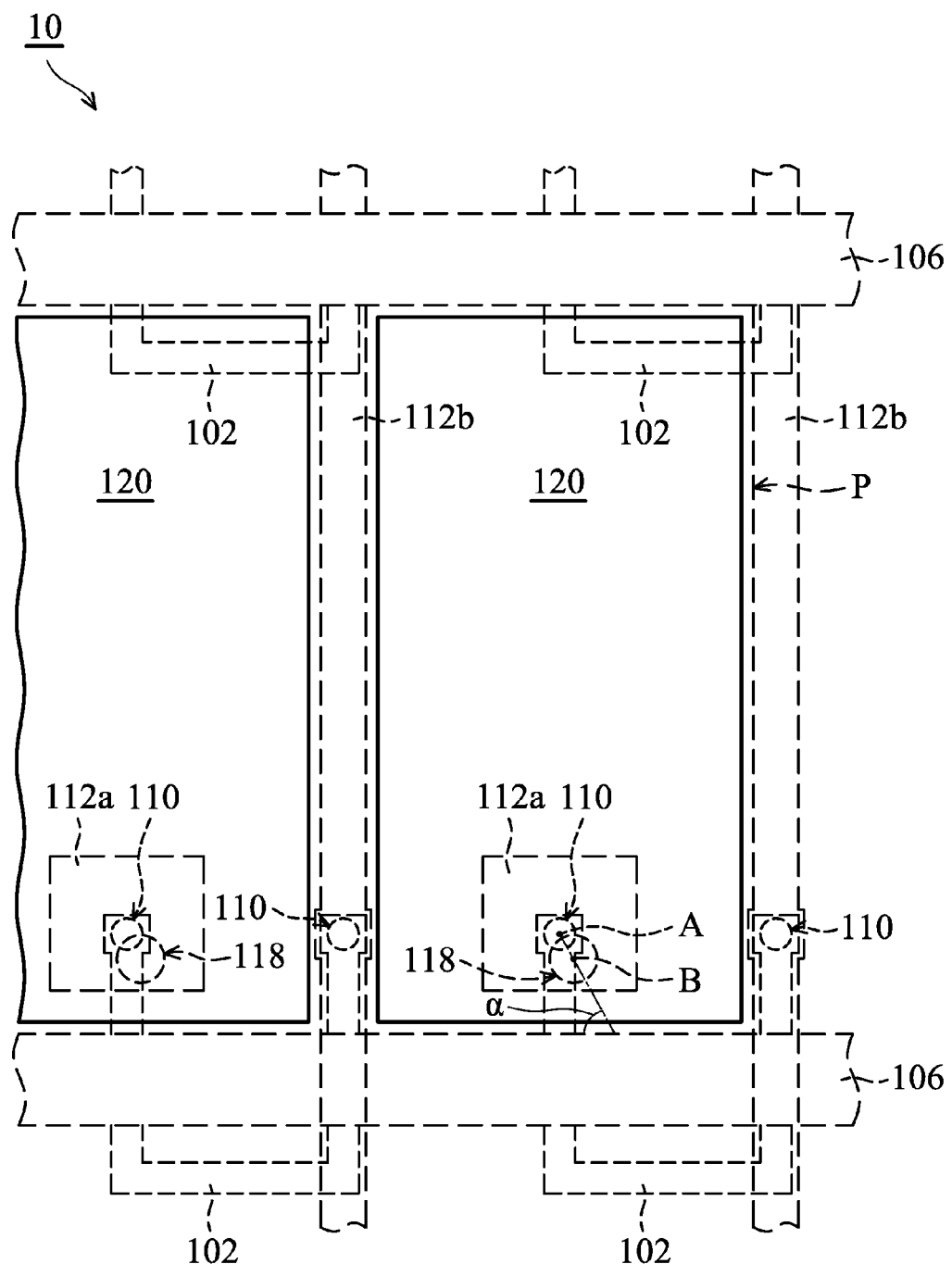
FIG. 4 is a schematic top view showing the layout of an array substrate according to yet another embodiment of the invention.

As shown in FIG. 1, a connection line A-B between the geometric center A of the first opening 110 and the geometric center B of the adjacent second opening 118 in the pixel region P and the first metal layer 106 have an included angle α of substantially 90 degrees from the top-view. The connection line A-B is perpendicular to the first metal layer 106. However, for the purpose of increasing the coverage area of the transparent electrode 120 in the pixel regions P and the effective aperture ratio of the pixel regions P, the location of the second opening 118 can be adjusted to be closer to the data line 112b at the left side (see FIG. 3) or closer to the data line 112b at the right side (see FIG. 4), such that the connection line A-B between the geometric center A of the first opening 110 and the geometric center B of the second opening 118 in the pixel region P is no longer perpendicular with the first metal layer 106. Therefore, the connection line A-B and the first metal layer 106 may have an included angle α other than 90 degrees, and the included angle α can be greater than 0 degrees and be less than 90 degrees.

Figure 5:
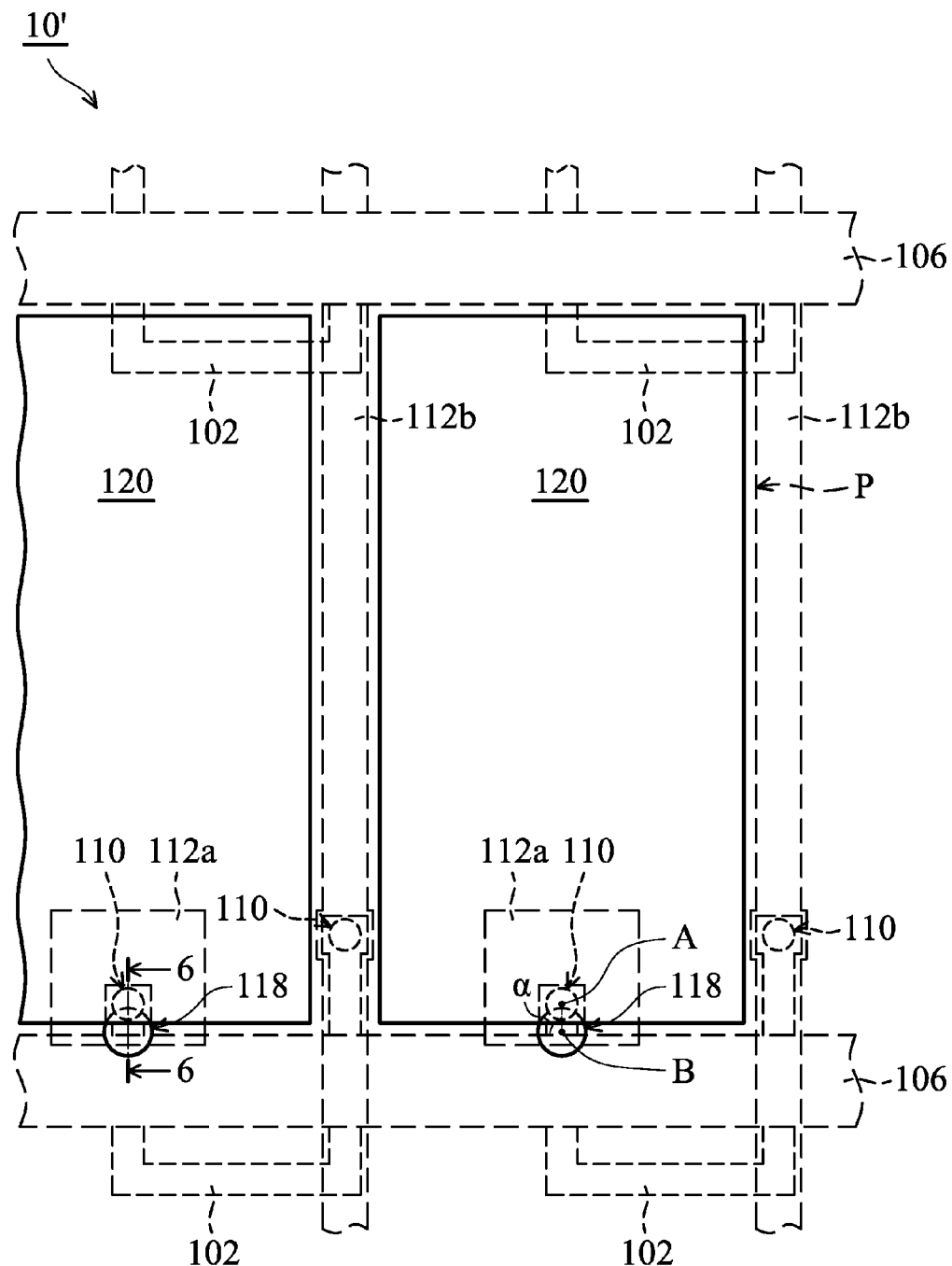
FIG. 5 is a schematic top view showing the layout of an array substrate according to another embodiment of the invention.
Figure 6:
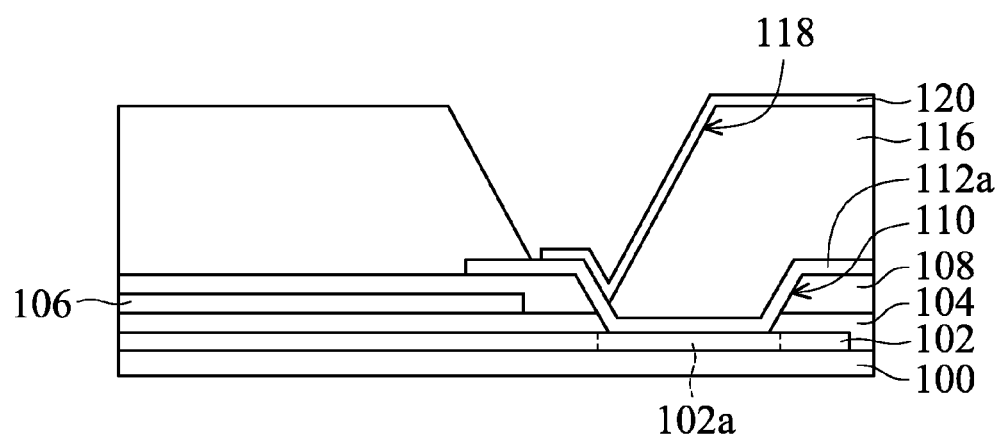
FIG. 6 is a schematic view showing a cross section of the array substrate along the line 6-6 in FIG. 5.

FIGS. 5-6 are schematic diagrams showing another exemplary array substrate 10'. FIG. 5 is a schematic top view of the array substrate 10', and FIG. 6 is a schematic view showing a cross section of the array substrate 10' along the line 6-6 in FIG. 5. Herein, the array substrate 10' shown in FIGS. 5-6 is obtained by modifying the array substrate 10 shown in FIGS. 1-2. Therefore, the same reference numbers in FIGS. 5-6 represent the same components and only differences between the array substrates 10 and 10' are discussed as follows.

As shown in FIG. 5, the relative locations of the metal pad 112a, portions of the semiconductor layer 102, and the components adjacent thereto can be further adjusted to make the metal pad 112a and the second opening 118 partially overlap the first metal layer 106. Therefore, the transparent electrode 120 merely fills the second opening 118 in part to partially cover the top surface of the second insulating layer 116, portions of the sidewall surface of the second insulating layer 116, and the top surface and the sidewall surfaces of the metal pad 112a exposed by the second opening 118.

As shown in FIG. 6, a schematic view showing a cross section of the array substrate 10' along the line 6-6 in FIG. 5 is illustrated. Herein, the transparent electrode 120 merely fills the second opening 118 in part to partially cover the top surface of the second insulating layer 116, portions of the sidewall surface of the second insulating layer 116 and the top surface and the sidewall surfaces of the metal pad 112a exposed by the second opening 118, and the overlying metal pad 112a partially overlaps the underlying first metal layer 106.

Still referring to FIGS. 5-6, the first opening 110 in the pixel region P and the second opening 118 crossing the pixel region P and the metal line 106 are tapered shaped openings having sizes reduced from top to bottom thereof. For the purpose of simplicity, only a maximum size of the first opening 110 and the second opening 118 are shown in FIG. 5, and the first opening 110 and the second opening 118 have a geometric center A and B, respectively.

Figure 7:
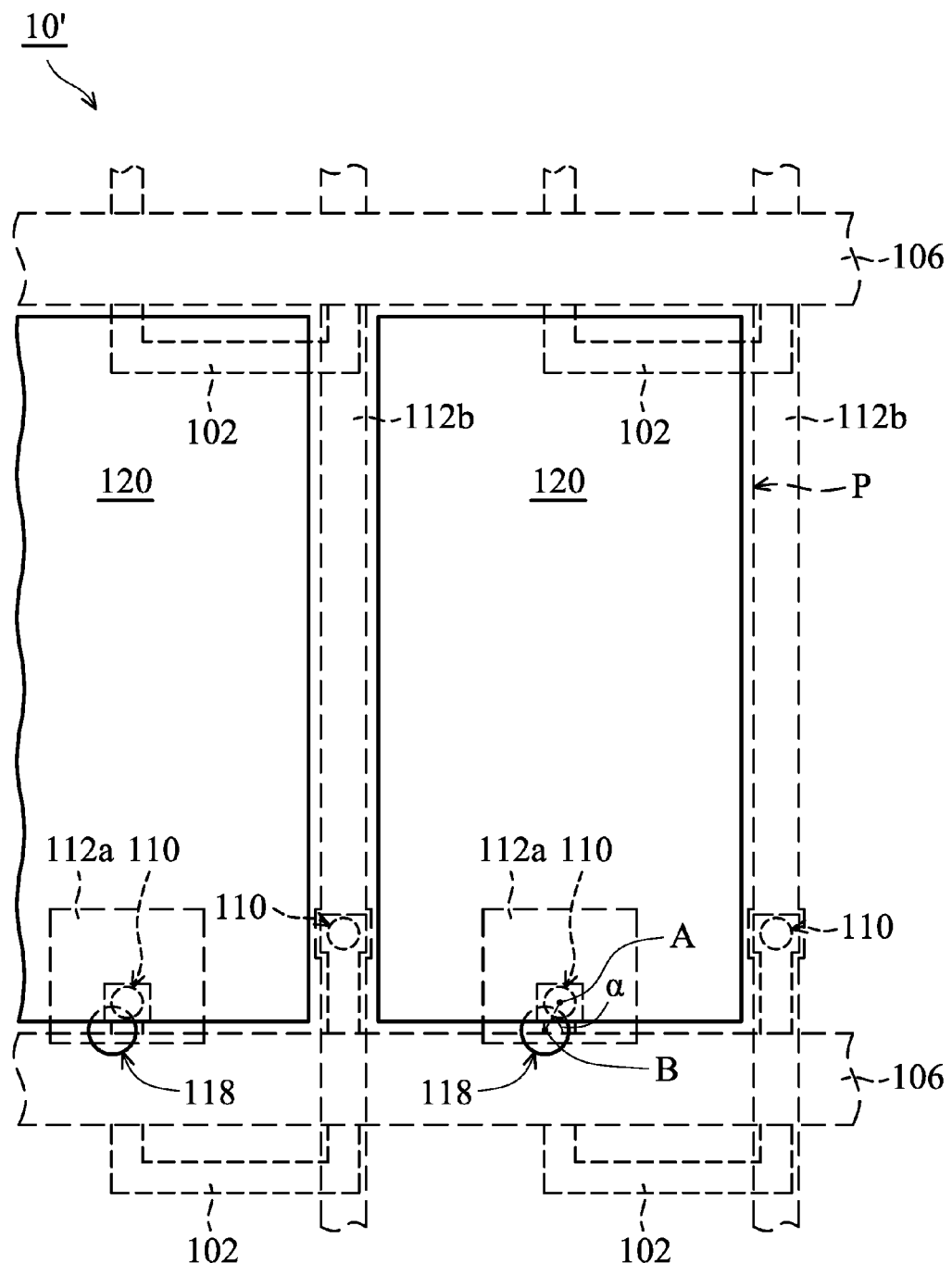
FIG. 7 is a schematic top view showing the layout of an array substrate according to another embodiment of the invention.
Figure 8:
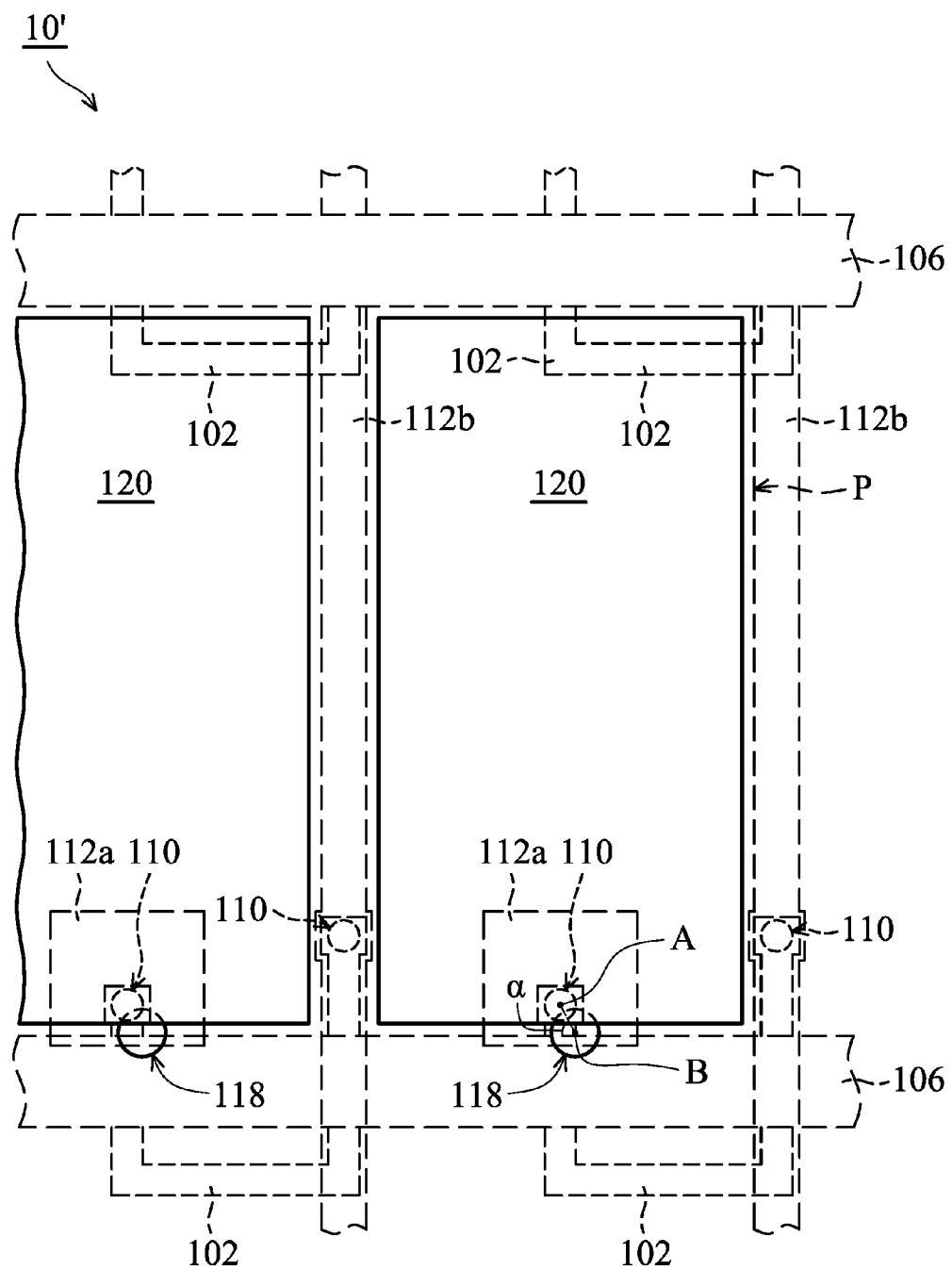
FIG. 8 is a schematic top view showing the layout of an array substrate according to yet another embodiment of the invention.

As shown in FIG. 5, a connection line A-B between the geometric center A of the first opening 110 and the geometric center B of the adjacent second opening 118 in the pixel region P and the first metal layer 106 have an included angle α of substantially 90 degrees, such that the connection line A-B is perpendicular to the first metal layer 106. However, for the purpose of increasing the coverage area of the transparent electrode 120 in the pixel regions P and the effective aperture ratio of the pixel regions P, the location of the second opening 118 can be adjusted so that it is closer to the data line 112b at the left side (see FIG. 7) or closer the data line 112b at the right side (see FIG. 8), such that the connection line A-B between the geometric center A of the first opening 110 and the geometric center B of the adjacent second opening 118 in the pixel region P is no longer perpendicular with the metal line 106. Therefore, the connection line A-B and the metal line 106 may have an included angle α other than 90 degrees, and the included angle α can be greater than 0 degrees and less than 90 degrees.

Similar to that shown in FIGS. 1-4, since the second opening 118 is formed at a place between the first opening 110 and the first metal layer 106 in the array substrate 10', the coverage area of the transparent electrode 120 in the pixel region P can be increased, thereby improving the aperture ratio of the pixel region.

In the embodiments shown in FIGS. 1-4 and FIGS. 5-8, the substrate 100 may comprise materials such as glass or plastic, the semiconductor layer 104 may comprise materials such as polysilicon, and the first insulating layer 108 and the third insulating layer 104 may comprise the same or different materials such as silicon oxide, silicon nitride, or a combination thereof. The first metal layer 106 may comprise materials such as tungsten or aluminum. The second insulating layer 116 may comprise insulating materials such as spin-on glass. The metal pads 112a and the data lines 112b may comprise materials such as tungsten and aluminum and can be formed simultaneously. The transparent electrode 120 may comprise transparent conductive materials such as indium tin oxide (ITO). The shape of the semiconductor layer 102 is not limited to the illustrated U-shape, and can be L-shaped or other shapes. Fabrication of the above components can be achieved by conventional array substrate fabrications and are not described here for the purpose of simplicity.

Figure 9:
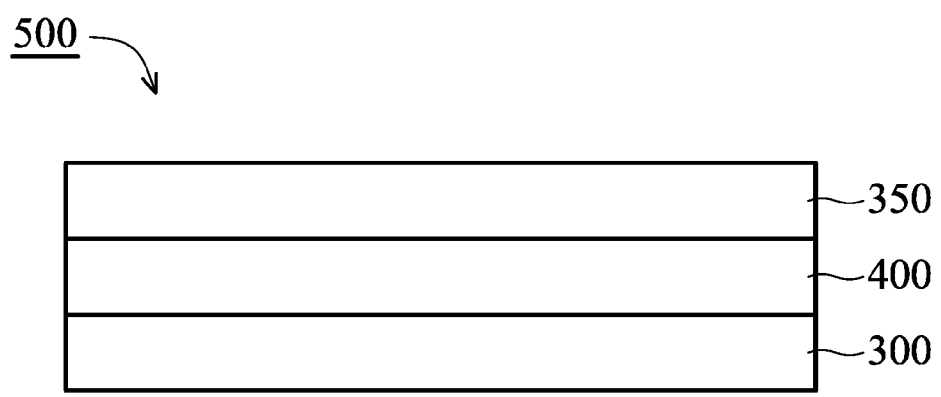
FIG. 9 is a schematic top view showing the layout of an array substrate according to another embodiment of the invention.

FIG. 9 is a schematic cross section showing a display device 500 according to an embodiment of the invention.

As shown in FIG. 9, the display device 500 comprises an array substrate 300, a transparent substrate 350, and a display layer 400 disposed between the array substrate 300 and the transparent substrate 350. In one embodiment, the array substrate 300 of the display device may comprise the array substrates 10 and 10' shown in FIGS. 1-8 and further comprise other components such as pixel electrodes and common electrodes (not shown). According to various embodiments of the display device 500, such as a liquid-crystal display (LCD) device or an organic light-emitting diode (OLED) device, the display layer 400 may comprise a liquid-crystal layer or an organic light-emitting diode layer. According to various embodiments of the display device 500, such as a liquid-crystal display (LCD) device or an organic light- emitting diode (OLED) device, the second substrate 350 may comprise other components such as color filters (not shown), and the second substrate 350 may comprise transparent materials such as glass or plastic.

While the invention has been described by way of example and in terms of the preferred embodiments, it is to be understood that the invention is not limited to the disclosed embodiments. On the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A display device, comprising:
a first substrate;
a semiconductor layer disposed over the first substrate;
a gate line disposed over the first substrate, wherein the gate line overlaps the semiconductor layer;
a first insulating layer disposed over the semiconductor layer, wherein a first opening is formed through the first insulating layer;
a metal pad disposed over the first insulating layer, wherein the metal pad is electrically connected to the semiconductor layer through the first opening;
a data line disposed over the first insulating layer, wherein the data line crosses the gate line and the data line is electrically connected to the metal pad; and
a second insulating layer disposed over the metal pad and the first insulating layer, wherein a second opening is formed through the second insulating layer,
wherein the second opening at least partially overlaps the gate line.

2. The display device as claimed in claim 1, wherein the metal pad at least partially overlaps the gate line.

3. The display device as claimed in claim 1, wherein the second opening at least partially overlaps the first opening.

4. The display device as claimed in claim 1, wherein an area of the metal pad exposed by the second opening is a first area, an area of the semiconductor layer exposed by the first opening is a second area, and the first area is greater than the second area.

5. The display device as claimed in claim 1, wherein the size of the second opening is greater than the size of the first opening.

6. The display device as claimed in claim 1, wherein the second opening exposes a portion of the metal pad, and the portion of the metal pad is disposed over a sidewall surface of the first insulating layer.

7. The display device as claimed in claim 1, further comprising:
a second substrate; and
a display layer disposed between the second substrate and the first substrate.

8. The display device as claimed in claim 7, wherein the display layer is a liquid-crystal layer.

9. The display device as claimed in claim 7, wherein the display layer is an organic light-emitting diode layer.

10. The display device as claimed in claim 1, further comprising a transparent electrode, wherein the transparent electrode is electrically connected to the metal pad through the second opening.

11. The display device as claimed in claim 1, wherein the first opening has a first geometric center, the second opening has a second geometric center, an extension line passing through the first geometric center and the second geometric center is inclined to the gate line with an included angle, and the included angle is greater than 0 degrees and less than 90 degrees.

12. A display device, comprising:
a first substrate;
a semiconductor layer deposed over the first substrate;
a gate line disposed over the first substrate, wherein the gate line overlaps the semiconductor layer;
a first insulating layer disposed over the semiconductor layer, wherein a first opening is formed through the first insulating layer;
a metal pad disposed over the first insulating layer, wherein the metal pad is electrically connected to the semiconductor layer through the first opening;
a data line disposed over the first insulating layer, wherein the data line crosses the gate line and the data line is electrically connected to the metal pad; and
a second insulating layer disposed over the metal pad and the first insulating layer, wherein a second opening is formed through the second insulating layer,
wherein the metal pad at least partially overlaps the gate line.

13. The display device as claimed in claim 12, wherein the second opening at least partially overlaps the first opening.

14. The display device as claimed in claim 12, wherein the size of the second opening is greater than the size of the first opening.

15. The display device as claimed in claim 12, further comprising:
a second substrate; and
a display layer disposed between the second substrate and the first substrate.

16. The display device as claimed in claim 15, wherein the display layer is a liquid-crystal layer.

17. The display device as claimed in claim 15, wherein the display layer is an organic light-emitting diode layer.

18. The display device as claimed in claim 12, further comprising a transparent electrode, wherein the transparent electrode is electrically connected to the metal pad through the second opening.

19. The display device as claimed in claim 12, wherein the first opening has a first geometric center, the second opening has a second geometric center, an extension line passing through the first geometric center and the second geometric center is inclined to the gate line with an included angle, and the included angle is greater than 0 degrees and less than 90 degrees.

* * * * *